May 15, 1962 K. SIEBERTZ ET AL 3,035,183

MONOSTABLE, BISTABLE DOUBLE BASE DIODE CIRCUIT UTILIZING HALL EFFECT TO PERFORM SWITCHING FUNCTION

Filed May 22, 1957

Inventors.
Karl Siebertz,
Heinz Henker, &
Heinz Dorendorf.
By [signature] Atty.

3,035,183
Patented May 15, 1962

3,035,183

MONOSTABLE, BISTABLE DOUBLE BASE DIODE CIRCUIT UTILIZING HALL EFFECT TO PERFORM SWITCHING FUNCTION

Karl Siebertz, Heinz Henker, and Heinz Dorendorf, Munich, Germany, assignors to Siemens and Halske Aktiengesellschaft Berlin and Munich, a German corporation Filed May 22, 1957, Ser. No. 660,980
Claims priority, application Germany June 14, 1956
12 Claims. (Cl. 307—88.5)

The invention relates to a double-base semiconductor switching device having two ohmic contact base terminals, a so-called double-base diode or filamentary diode, the terminals of which are at different potential and having at least one rectifying electrode adapted to perform emitting functions.

Known double base diodes represent versatile semiconductor components. Such a diode comprises a semiconductor body, especially a single crystal body, at the ends or opposite sides of which are provided barrier-free base contacts, and having upon the surface disposed between the base connections, at least one emitter electrode which exhibits rectifying properties. A double base diode which is provided with an additional electrode which is circuited as collector, is also referred to as double base transistor.

Double base semiconductor devices may be operated in diverse manner, namely, on the one hand as amplifiers and on the other hand for producing switching or triggering operations. The invention is concerned with the use of such a semiconductor device for producing switching or triggering operations.

In order to explain the various modes of operation, it shall be assumed that a voltage is placed at a point between the two base electrodes which produces in the semiconductor crystal an electric current flowing between the base electrodes. This current consists practically only of majority carriers. The base electrode from which the majority carriers emanate is customarily designated as $B_1$, and the base electrode to which the majority carriers flow is customarily designated as $B_2$. When a voltage is placed at a point between the emitter electrode and the base electrode $B_2$, such that the pn-junction of the emitter is in flow direction, there will be injected minority charge carriers from the emitter into the semiconductor body, which carriers are driven to $B_1$ owing to the potential drop in the crystal. The resistance of the semiconductor body is thereby reduced in accordance with the magnitude of injection of minority carriers, such resistance reduction resulting in a variation of the current which is delivered from the bias voltage source between the two base electrodes. Accordingly, a double base semiconductor device circuited in this manner, will operate as amplifier wherein a weak signal at the emitter will cause a great voltage change at a load resistance in the circuit of the base electrodes.

However, entirely different circuit properties will be imparted to the same semiconductor device, when the bias voltage of the emitter electrode is placed at a point between the base electrode $B_1$ and the emitter. There are two possibilities in such case, one being productive of the known unipolar transistor and the other being productive of a device for producing switching or triggering operations. The invention is concerned with improving the second named device.

It must be considered in this connection that an injection of minority carriers will be impossible when the emitter is placed at a blocking potential which is with respect to the base electrode $B_1$ not between the potentials of the two base electrodes. However, a signal at the emitter effects a variation of the depth of the blocking layer at the emitter electrode, thereby producing a variation of the cross-sectional area of the path which is between the two base electrodes available for the current flow between the base electrodes. This mode of operation likewise results in an amplifier action in which the current between the two base electrodes is controlled by a signal placed on the emitter electrode.

However, when the blocking voltage of the emitter is so selected that its potential is between the potentials of the two base electrodes, practically no current will flow over the emitter owing to the bias voltage. This current can be operatively connected in diverse manner. For example, when the blocking voltage at the emitter is reduced to a point at which the end of the emitter electrode facing the base electrode $B_1$ is in flow direction, while the remaining part of the emitter electrode is still blocked, there will be injected minority charge carriers which flow toward $B_1$. The conductivity of the parts of the semiconductor body lying between the base electrode $B_1$ and the emitter will thereby be somewhat reduced, whereby the equipotential planes are shifted in the sense of a further reduction of the blocking voltage of the emitter. A further part of the pn-junction of the emitter is thereby brought into flow direction, thus increasing the injection of minority charge carriers. The resistance of the semi-conductor area between the base electrode $B_1$ is by this injection reduced, such reduction resulting in increase of emission of minority charge carriers, and such increased emission resulting in further reduction of the resistance. Accordingly, the action increasingly proceeds to a point until the potential difference between the region of the semiconductor practically disappears at the emitter. The characteristic curve correspondingly shows in the pass range a negative behavior.

The switching operation is customarily effected by properly poled impulses which are superposed either upon the emitter voltage or the bias between the two base electrodes, thus resulting directly in a current control of the semiconductor, which is in many cases undesired. Accordingly, the object of the invention is to respectively control or to release the electrical switching operation, in such a semiconductor device, without directly controlling or influencing the current of the semiconductor.

This object is achieved in accordance with the present invention by disposing on the semiconductor crystal between the base electrodes $B_1$—$B_2$ rectifying electrode which is positively biased to such potential, lying between the base potentials of its base electrodes, that the flow of current to the base is just prevented although a small additional voltage pulse would be sufficient to produce a flow of current, and by providing means for producing a constant or variable electric and/or magnetic field, such that at a given strength of the excited field, the electric equipotential planes in the semiconductor crystal between the electrodes $B_1$—$B_2$ vary, and particularly shift, in such a manner that a passage of current between the emitting electrode and base takes place. The semiconductor crystal is in this connection suitably made as a flat and preferably rectangular strip-like member and the magnetic field is oriented at right angles thereto.

Further objects, features and details of the invention will appear from the description which is rendered below with reference to the accompanying drawing wherein.

Figures 1, 2:
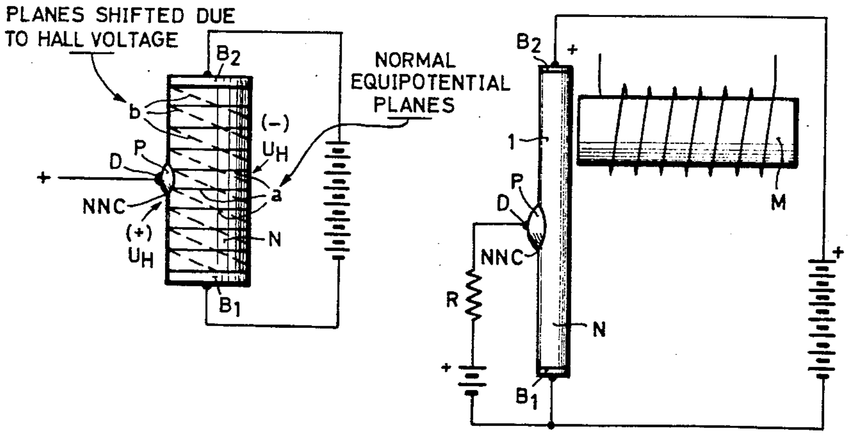
FIG. 1 is a semi-diagrammatic figure of a semiconductor circuit embodying the present invention.
FIG. 2 illustrates one form of circuit arrangement.

In FIG. 1, there is shown a semiconductor body marked 1, which is assumed to be n-conductive. It is of strip shape, that is, it is of relatively large length and width as compared with the thickness of the crystal at right angles to the plane of the drawing. $B_1$ and $B_2$ are ohmic contact electrodes. On the one narrow side, to the left in the figure, there is disposed a rectifying electrode D such as as is provided in known manner in filamentary diodes, for instance in the form of a p-n-junction, the respective zones being indicated in the drawing as P and N, which has such a high positive potential with respect to the base electrode $B_2$ that a passage of current is normally just prevented (the letters NNC on the drawing indicating normally-nonconducting).

The semiconductive material should be so selected that the minority carriers do not have too short a life. It should furthermore be observed that the semiconductor material has a relatively low intrinsic conductivity as compared with the conductivity of the impurity centers, and the density of the impurity centers should preferably be at least one order of magnitude higher than the carrier density of the intrinsic conductivity. It is essential for the semiconductive material to have the phenomena of the Hall effect, that is, that upon the application of a magnetic field at right angles to the surface of the diode upon the flow of current between the base electrodes a voltage, the so-called Hall voltage, occurs at the two sides not contacted by the base. At right angles to the surface of the diode, that is, at right angles to the plane of the drawing, a magnetic field U of suitable value H is now applied. Upon connecting the magnetic field, current flow takes place between the emitting electrode and the base $B_1$. The operation of this device is based essentially on the following physical processes.

Upon current flow between the base electrodes $B_2$ and $B_1$, the equipotential planes *a* shown in full lines are substantially at right angles to the axis marked *c*. If now a magnetic field H is applied, as described above, in such a manner that the Hall voltage on the side of the emitting electrode D has a negative value, the equipotential lines will be shifted so that they assume the form shown in dotted lines *b*. They will be displaced by the Hall voltage produced so that the current flow is facilitated and made possible. With a fixed bias of the emitting electrode D, the potential in the semiconductor crystal will have dropped so far at the level D that the p-n-junction makes possible the passage of the current. As a result, minority carries (in the embodiment of the example defect electrons) flow into the crystal body and make the region thereof which is located between D and $B_1$ low ohmic. Accordingly, the potential of the crystal at D is further decreased and the flux flow through D to the base electrode $B_2$ increases tremendously. The diode thus makes possible the flow of current in the flux direction.

There are various circuit connection possibilities for the use of a semiconductor device in accordance with the invention. For instance, the feed line of the emitting electrode may be provided with a series resistance. With suitable dimensioning, the result will be that the current flow in the crystal ceases after the disconnection of the magnetic field. The corresponding arrangement may be termed a monostable circuit.

If a series resistor is omitted, the current flow in the crystal diode in general continues upon disconnection of the magnetic field; the device operates in this case in a bistable manner.

The disconnecting of the current must be effected by special means. For instance, there may be used a field which is opposed to the magnetic field originally employed, or the original steady-current state can be restored by an external change in voltage, for instance at the emitting electrode interruption of the circuit of the base electrodes is also possible. In case of the presence of a series resistor, switching in the direction of flux flow is made difficult and on the other hand switching back into the cut-off condition is facilitated. In order to reduce this effect of the series resistance or even reverse it, the series resistor is so selected in accordance with a further feature of the invention, that its ohmic value is dependent on the intensity of the applied magnetic field, for instance the resistor itself may be made of semiconductive material and particularly of a $A^{III}B^{V}$-compound.

In accordance with a special further feature of the invention, the means for producing a magnetic and/or electric field are so arranged that only a part of the surface between the two base electrodes—the surface adjoining one side and located between the emitting electrode and one base electrode and possibly also the emitting zone remaining free of the magnetic field—is permeated by the magnetic field when the latter is connected, producing a change in electric resistance in such part by which the equipotential lines of a potential difference existing between the base electrodes are so displaced that minority carries can flow out of the emitter, which is at the indicated potential, into the base region and cause a passage of current there, thus causing the diode to flip in direction of the flux flow.

FIG. 2 shows by way of example an embodiment of this further embodiment of the invention. 1 is the semiconductor crystal with the base zone which connects the two ohmic contact base electrodes $B_1$ and $B_2$. D is a rectifying emitting electrode. M is an electromagnet which produces a magnetic field in the upper part of the semiconductor body 1 throughout the entire zone or in a part of the zone between D and $B_2$.

A voltage is applied to the base electrodes. The base electrode $B_2$ may in particular be at a positive potential with respect to the base electrode $B_1$. The emitting electrode D should also have a positive potential with respect to the base electrode $B_1$ which potential however should lie between the respective bias potentials of the base electrodes $B_1$ and $B_2$, but lower and preferably only slightly lower than the voltage necessary for the cut-off condition. In this condition, the diode is non-conductive that is, no current flows between $B_2$ and $B_1$. Upon connecting the magnetic field, the resistance in the region between $B_2$ and D now changes; in particular, it increases. The potential lines between $B_2$ and $B_1$ are crowded together due to the increased potential drop in the region between $B_2$ and D, and as a result, the potential in the semiconductor crystal which is opposite the electrode D is reduced to such an extent that minority carries can flow therefrom into the base region. They effect there in known manner an increase of the conductivity so that now a flow of current can take place between the base electrode $B_2$ and the base electrode $B_1$. The diode is thus triggered to pass condition.

Instead of the means for producing the magnetic field, there may also be provided means for producing an electric field to cause an increase of the resistance in the indicated region or a temporary change of potential at the emitting electrode; electrical and magnetic fields may be used combined.

The device in accordance with the invention may also be modified by employing instead of the region within the diode which is permeated or traversed by a magnetic field, a resistance which is dependent on the magnetic field and connected as series resistor separately in front of the diode. When the magnetic field is connected, the resistivity of this resistor increases; the potential difference at the filamentary diode is reduced to such an extent that the diode changes to flow or pass condition.

In the feed path to the emitting electrode D, there may be inserted a series resistance R which for instance causes the diode to flip back into cut-off condition upon disconnecting the magnetic field. However, means may also be provided in known manner so that the electrode remains in pass condition after disconnection of the magnetic field.

Within the region affected by the field, there may also be provided one or more p-n-junctions, for producing, for instance, an exponential dependence of the resistance on the field strength.

Figure 3:
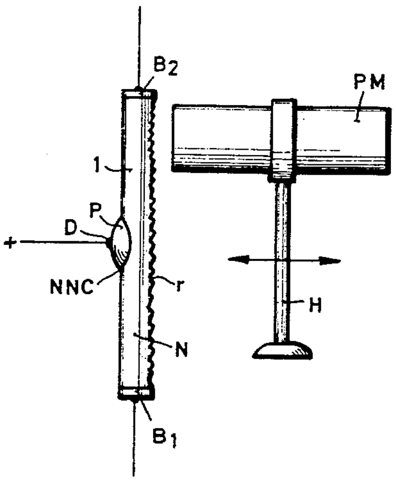
FIG. 3 illustrates a modified form of the invention.

As illustrated in FIG. 3, on the diode, there may also be arranged, in the region affected by the magnetic field, a magnetic barrier layer which may, for instance, be produced by making the one base-free narrow side of the semiconductor crystal very rough, as indicated at *r*, by mechanical or chemical means, while the opposite narrow side is made as smooth as possible. The charge carriers deflected by the magnetic field will be preferentially recombined at the rough surface while they can continue to flow unimpeded on the other side. Depending on the direction of the magnetic field and/or the flow of current between the base electrodes, blocking or flow of the base current can be obtained.

One particularly favorable use of the device in accordance with the invention resides in affecting an electric circuit by means of a mechanical motion. This may for instance, as illustrated in FIG. 3, be accomplished by guiding a permanent magnet PM on a mechanical support H over the semiconductor body so that the latter is subjected to a varying magnetic field as the magnet is moved toward and away from the semiconductor. If the action of the magnetic field is sufficiently strong, that is, if the magnet pole is brought close enough to the semiconductor, current will flow in case of suitable biasing of the emtiting electrode.

Figure 4:
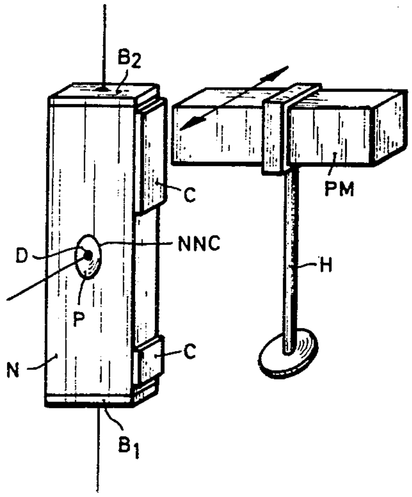
FIG. 4 illustrates still another modified form of the invention.

FIG. 4 illustrates the use of magnetized ferrite or iron discs C which may be applied on one or both sides of the crystal body. In some cases, it is advisable to insulate these discs from the semiconductor. These discs serve to increase the mechanical strength of the crystal and to strengthen the magnetic field.

Devices in accordance with the invention are particularly suitable for self-excitation or regeneration of mechanical and/or electrical oscillatory systems such as they are for instance used for the balance wheels or pendulums of electric clocks. Other possibilities reside in using devices in accordance with the invention as storage members or for the control of electric machines.

The control by magnetic and/or electric fields in accordance with the invention may also be combined with carrier-injection control in accordance with the proposals mentioned or else the known devices. In particular, it is possible to provide several emitting electrodes rather than a single one and/or desired if, also collectors. Further modifications of the embodiment given by way of example consist therein that the lines of force of the control field or fields pass through the semiconductor crystal only at certain, if desired variable places or that several individual semiconductor crystals are combined with one another only a part of which are exposed to the field control. Finally, it may also be mentioned that the field control may be used not only for switching purposes but also for amplifying purposes.

With respect to the use of the invention, it may be stated that it may be advantageously employed practically in all cases for which relays have been used up to the present time, and thus, for instance, also in telephone selector technique, particularly in cross-bar systems in which contact relays have been used up to the present time. Its use is also important in connection with clocks, particularly for the contact-free control of mechanical systems by a balance wheel, a pendulum or some other frequency-determining means.

Changes may be made within the scope and spirit of the appended claims.

We claim:

1. A double-base semiconductor switching device comprising a semiconductor crystal, two base electrodes connected with said crystal in barrier-free manner, at least one pn-junction electrode connected with said crystal intermediate said base electrodes, means for applying to said base electrodes different bias potentials and thereby causing current to flow in said semiconductor crystal between said base electrodes, means for applying to said pn-junction electrode a bias potential lying between the bias potentials applied to said base electrodes which is effective to hold said pn-junction normally in cut-off condition, means for producing in at least part of said crystal a magnetic field, said magnetic field being effective, due to the Hall effect resulting therefrom, to cause respectively increase and decrease of the potential of said pn-junction electrode respectively above and below the bias potential applied thereto, and control means for varying the field permeating said semiconductor crystal and thereby determine the switching of said pn-junction between conduction and cut-off.

2. A double-base semiconductor switching device according to claim 1, comprising an n-conducting rod-shaped semiconductor crystal, said base electrodes being carried by said crystal at the opposite ends thereof, a voltage source for placing to said pn-junction electrode a positive bias which is, with respect to the base electrode lying at the lower potential, of a magnitude which is in the absence of the magnetic field just sufficient to hold said pn-junction electrode is cut-off condition.

3. A double-base semiconductor switching device according to claim 1, wherein said pn-junction electrode is disposed upon a point along the surface of said semiconductor crystal at which occurs the maximum shifting of the equipotential planes effected by the magnetic field.

4. A double-base semiconductor switching device according to claim 1, comprising a resistor connected in the circuit of said pn-junction electrode.

5. A double-base semiconductor switching device according to claim 4, wherein the resistivity of said resistor is of a value such that current flow through said pn-junction electrode is automatically interrupted responsive to cessation of the magnetic field.

6. A double-base semiconductor switching device according to claim 4, wherein the resistivity of said resistor is of a value such that current flow through said pn-junction electrode is maintained upon cessation of the magnetic field.

7. A double-base semiconductor switching device according to claim 6, wherein the equipotential planes of the electric field in said crystal are shifted by the magnetic field so that the voltage at the pn-junction electrode is reversed from pass condition to cut-off condition, thereby interrupting the current flowing through said pn-junction electrode.

8. A double-base semiconductor switching device according to claim 1, comprising at least one layer of magnetizable material carried by said semiconductor crystal.

9. A double-base semiconductor switching device according to claim 1, wherein the means for producing the magnetic field are so arranged that only part of the surface between the two base electrodes is traversed by said field upon connection thereof and producing in said part a change in electrical resistance by which the equipotential lines of a potential difference existing between the base electrodes are so displaced that minority carriers can flow from the pn-junction electrode into the base section to cause the passage of current therein and therefore causing the device to flip into pass condition.

10. A double-base semiconductor switching device according to claim 9, wherein there is within the region traversed by the magnetic field a magnetic barrier layer formed by a roughened surface of the side arranged at right angles to the base electrodes for recombining charge carriers.

11. A double-base semiconductor switching device according to claim 1, wherein the zone of action of said pn-junction electrode remains free of the magnetic field.

12. A double-base semiconductor switching device according to claim 1, comprising a permanent magnet and a carrier therefor, for variable disposal thereof with respect to said semiconductor crystal, for producing the magnetic field to effect the switching-in of the current for the pn-junction electrode.

References Cited in the file of this patent

UNITED STATES PATENTS

| | | |
|---|---|---|
| 2,553,490 | Wallace | May 15, 1951 |
| 2,553,491 | Shockley | May 15, 1951 |
| 2,597,028 | Pfann | May 20, 1952 |
| 2,695,930 | Wallace | Nov. 30, 1954 |
| 2,733,359 | Brown | Jan. 31, 1956 |
| 2,736,822 | Dunlap | Feb. 28, 1956 |
| 2,736,858 | Welker | Feb. 28, 1956 |
| 2,752,553 | Dunlap | June 26, 1956 |
| 2,862,184 | Logini | Nov. 25, 1958 |
| 2,863,056 | Pankove | Dec. 2, 1958 |
| 2,863,070 | Suran et al. | Dec. 2, 1958 |
| 2,869,001 | Welker | Jan. 13, 1959 |